United States Patent [19]
Quist

[11] 3,946,280
[45] Mar. 23, 1976

[54] OVERLOAD PROTECTION CIRCUIT
[75] Inventor: Eric G. Quist, Roxbury, Conn.
[73] Assignee: Branson Ultrasonics Corporation, New Canaan, Conn.
[22] Filed: Mar. 10, 1975
[21] Appl. No.: 557,079

[52] U.S. Cl............. 317/31; 317/33 R; 317/33 SC; 317/27 R; 330/207 P; 331/62; 307/202 R
[51] Int. Cl.² ......................................... H02H 7/20
[58] Field of Search ... 317/31, 33 R, 33 VR, 33 SC, 317/27 R; 331/62; 330/207 P; 307/202 R; 328/147, 133; 323/20; 324/158 T

[56] References Cited
UNITED STATES PATENTS

| | | | |
|---|---|---|---|
| 3,432,691 | 3/1969 | Shoh | 310/9 X |
| 3,519,884 | 7/1970 | Paddison et al. | 317/47 X |
| 3,577,035 | 5/1971 | Constable | 317/31 |
| 3,835,412 | 9/1974 | Honda et al. | 330/207 P |
| 3,898,559 | 8/1975 | Westra | 324/158 T |

Primary Examiner—J D Miller
Assistant Examiner—Patrick R. Salce
Attorney, Agent, or Firm—Ervin B. Steinberg; Philip J. Feig

[57] ABSTRACT

This invention refers to an overload protection circuit for an oscillatory circuit driving an electro-acoustic converter and more specifically concerns a circuit for automatically inhibiting the oscillatory circuit in the presence of an overload. The overload protection circuit monitors the collector-emitter voltage signal and the base-emitter voltage signal for providing an overlap signal responsive to the interval when both mentioned voltage signals are in their high condition. Such a condition is indicative of the power dissipated in a switching transistor of the oscillatory circuit. The overlap signal is integrated and the integrated signal is compared to a predetermined voltage level. When the integrated signal exceeds the predetermined voltage level, the oscillatory circuit is inhibited.

10 Claims, 4 Drawing Figures

OVERLOAD PROTECTION CIRCUIT

SUMMARY OF THE INVENTION

This invention broadly relates to a overload protection circuit for an oscillatory circuit driving an electro-acoustic converter and more specifically concerns a circuit for automatically turning off the oscillatory circuit in the presence of an overload. Quite specifically, the overload protection circuit disclosed hereafter monitors the voltage condition at the base electrode of a power transistor, such voltage being indicative of the current flowing in the collector electrode, and the collector electrode voltage of the switching transistor used to drive the converter. In the event that both voltages are simultaneously in the high condition, that is, the transistor is dissipating excessive power, for a period of time in excess of a predetermined amount, the oscillatory circuit is switched off.

One problem encountered in operating oscillatory circuits or power supplies for providing energy to an electro-acoustic converter is the wide range of load apparent at the converter. The oscillatory circuit must provide the power without a failure of the switching transistor which drives an output transformer for delivering the power to the converter. The switching transistor has a maximum allowable power dissipation inherent in its design and manufacture. The maximum allowable power dissipation is proportional to the product of the collector-emitter voltage (Vce), hereinafter referred to as the collector voltage, and the collector current (Ic).

The provision of an overload protection circuit in an oscillatory circuit allows more power to be delivered to the converter than with a conventional oscillatory circuit. The oscillatory circuit, specifically the switching transistor, is operated closer to the maximum allowable power dissipation condition, since in the event of an overload condition the protection circuit will turn off the oscillatory circuit. In prior oscillatory circuits, the switching transistor has been operated at a condition well below the maximum permissible power dissipation responsive to varying load conditions. The present invention, therefore, provides an improvement over heretofore known oscillatory circuits.

In prior overload protection circuits, the collector voltage and collector current are monitored and the oscillatory circuit is turned off when the collector current exceeds a predetermined value at the time when the collector-emitter voltage is at its high condition. These prior current monitoring circuits require current sensing transformers and the like which are generally costly and large. In an ideal oscillatory circuit, the collector voltage changes from the condition of zero volts, when the transistor is on and the collector current is flowing from the direct current power supply voltage, to the condition when the transistor is off and no collector current flows. In the ideal situation no power is dissipated in the transistor since power is the product of the collector voltage and the collector current in the transistor. In an actual circuit or when the oscillatory circuit is overloaded, the transistor is not completely turned on and the collector-emitter voltage is, therefore, not zero when a collector current is flowing. The power dissipated during this condition will, in a relatively short period of time, cause transistor failure.

The present invention relies upon the fact that the collector current will flow only when the base electrode of the transistor has a positive voltage with respect to the emitter electrode, hereinafter referred to as the base voltage. Therefore, if the base voltage and collector voltage are simultaneously in their high conditions, there is collector current at a time when the collector-emitter voltage is high and the transistor is dissipating heat. In the present invention, the two electrode voltages, collector and base, are monitored with references to the emitter electrode voltage for providing a signal indicative of the overlap of the waveforms. The overlap, which occurs when both junction voltages are in the high voltage condition, is indicative of the power dissipation in the switching transistor. The overlap signal is integrated and the integrated value is compared to a predetermined level. If the integrated signal exceeds the maximum allowable power dissipation level represented by the predetermined level, a signal is produced for causing the oscillatory circuit to be turned off.

Additional means are provided for overriding the protection circuit during the initial start up of the oscillatory circuit and for ensuring that the power supply is maintained off in the absence of a turn on signal.

Another undesired mode in an oscillatory circuit for driving an electro-acoustic converter occurs when the frequency of the converter changes under the influence of an overload. This condition causes the applied high frequency signal to the converter to be at an incorrect frequency. An integrator circuit in the overload protection circuit will provide a signal of increased amplitude when the converter shifts to a higher frequency. The signal is processed as an overload indication which causes the oscillatory circuit to be turned off.

A principal object, therefore, of the present invention is the provision of an overload protection circuit for use in an oscillatory circuit used for driving an electro-acoustic converter, the protection circuit turning off the oscillatory circuit in the event of an overload condition.

Another object of the invention is the provision of an overload protection circuit for turning off an oscillatory circuit when the oscillatory circuit is operating at a non-desired high frequency due to an overload condition.

Another salient object of the invention is the provision of an overload protection circuit for preventing the failure of a switching transistor forming an essential part of an oscillatory circuit.

Further and still other objects of the present invention will become more clearly apparent from the following specification when taken in conjunction with the accompanying drawings.

DETAILED DESCRIPTION OF THE INVENTION

Figure 1:
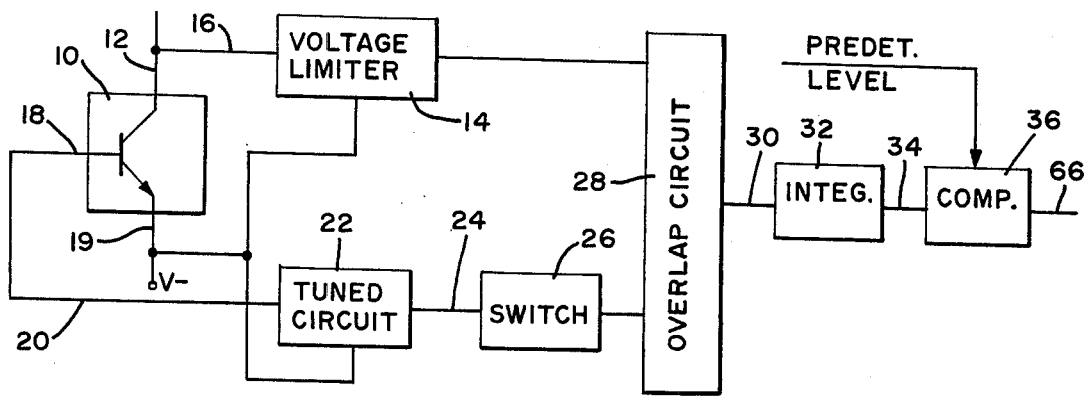
FIG. 1 is a schematic electrical block diagram of the present invention.

Referring to the figures, FIG. 1 in particular shows a schematic electrical block diagram of the overload protection circuit. A switching transistor 10 used in an oscillatory circuit for driving an electro-acoustic converter has its base voltage and collector voltage monitored to prevent failure of the transistor 10 during an overload condition. The voltage between the collector electrode 12 and the emitter electrode 19 of the transistor 10 is conducted to a voltage limiter 14 along conductor 16. The voltage limiter limits the relatively high peak to peak square wave voltage signal amplitude appearing at the collector electrode 12 to a predetermined value, typically 24 volts peak to peak (see FIG. 3, trace a).

The base electrode 18 of the transistor 10 is coupled via a conductor 20 to a tuned circuit 22. The voltage signal waveform between the base electrode 18 and the emitter electrode 19 contains spikes and switching transients which are undesirable. The tuned circuit, which is tuned at 20 kHz, converts the generally square wave voltage waveform along conductor 20 to a sinousoidal waveform (see FIG. 3, trace b). The tuned circuit 22 has an adjustable means for varying the phase of the output signal along conductor 24 as will be explained hereinafter.

The sinousoidal waveform, of approximately 10 volts peak to peak amplitude, causes a switch 26 to periodically turn off and on responsive to the amplitude of the sinousoidal signal. The waveform of the switch output is a nonsymmetrical square wave voltage signal as shown in FIG. 3, trace c.

Figure 3:
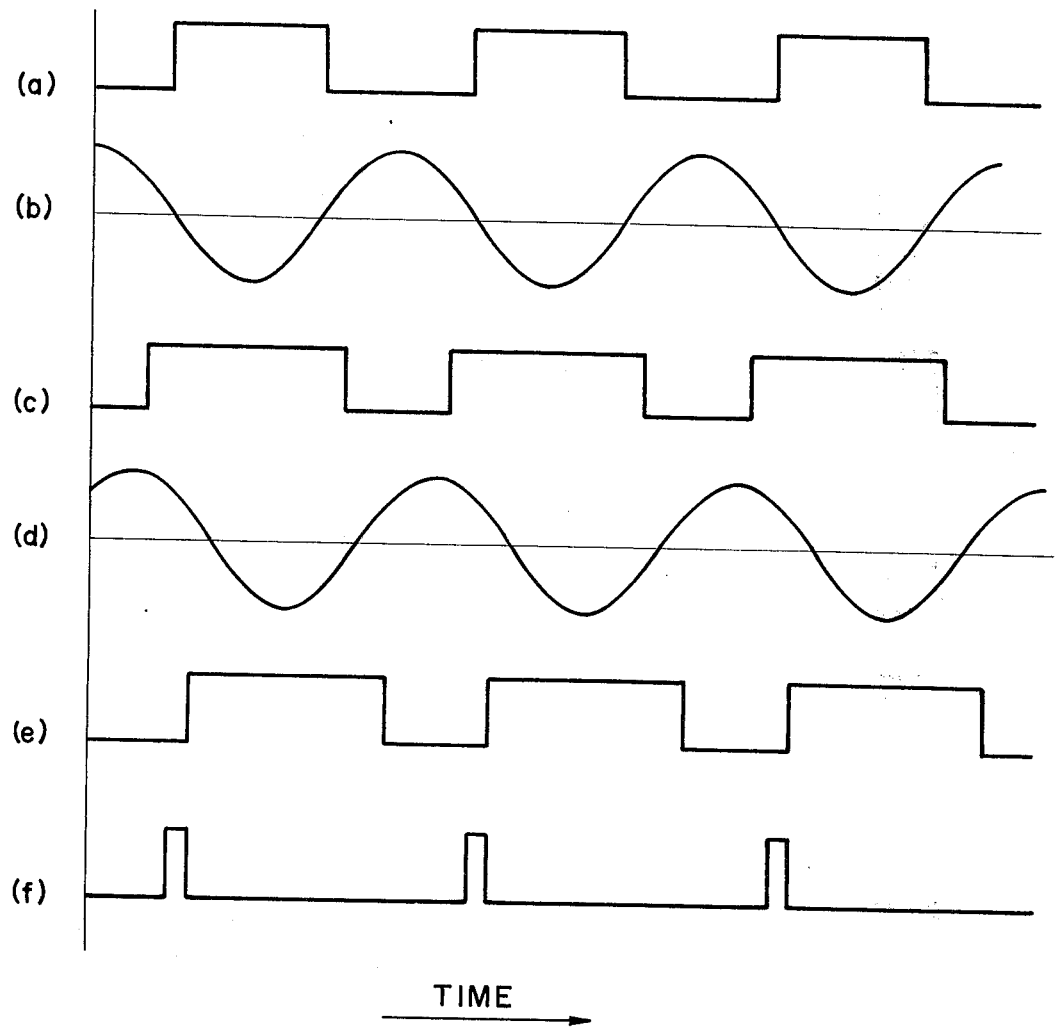
FIG. 3 is a drawing of the voltage signal waveforms generated within the embodiment per FIG. 1.

The waveforms illustrated in FIG. 3 traces a, b, and c represent the "ideal" situation. That is, the sinousoidal signal, which is representative of the collector current is perfectly in phase with the collector voltage waveform (FIG. 3, trace a). The switch 26 output does not overlap the collector voltage waveform. The term overlap refers to the condition when collector voltage waveform shown in trace a is in its high condition, simultaneously with the output of switch 26 shown in trace c being in its low state.

In FIG. 3, trace d, a sinousoidal waveform similar to that of trace b but with a phase difference is shown. In trace d, when the sinousoidal waveform is positive, the collector voltage (FIG. 3, trace a) is simultaneously positive. A different output from switch 26, as shown in FIG. 3, trace e is produced. In this case, there are time intervals when the collector voltage waveform is in its high condition, simultaneously with the switch 26 output being in its low condition. These two signals are provided as inputs to overlap circuit 28. The output voltage waveform of the overlap circuit 28 as shown in FIG. 3, trace f is a series of positive pulses corresponding in time to the interval when the collector voltage is in its high condition and the switch 26 output is in its low condition, that is, the transistor is dissipating power.

The output of the overlap circuit is conducted along conductor 30 to an integrator circuit 32. The integrator circuit 32 integrates the voltage waveform shown in FIG. 3, trace f and provides a direct current voltage signal responsive thereto. The integrated signal on conductor 34 is compared to a predetermined level in comparator 36. When the integrated signal exceeds the predetermined level, an overload signal is generated at conductor 66 which inhibits operation of the oscillatory circuit and prevents the destruction of the transistor 10.

While the above description is applicable to the current flowing during an overload condition, it is apparent that a frequency shift of the oscillatory circuit caused by an overload condition will cause a corresponding increase in the number of pulses in FIG. 3, trace f per unit of time and cause a resultant increase in the direct current signal output amplitude of the integrator 32. Thus, either excessive collector current flowing during the time the transistor 10 is "off" or a shift in the frequency of the oscillatory circuit resulting from an overload situation will have the same effect of causing the oscillatory circuit to be turned-off.

Figure 2:
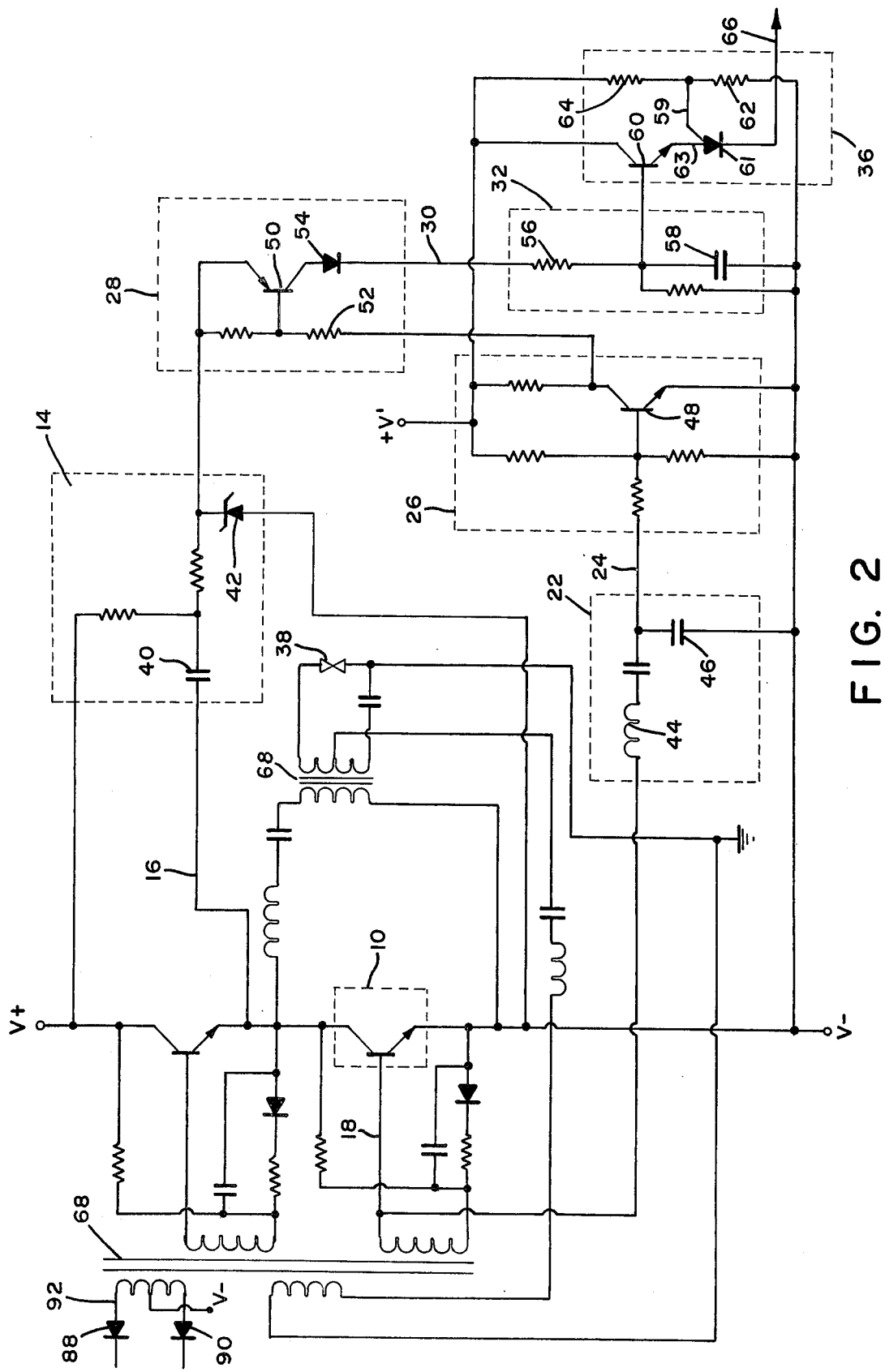
FIG. 2 is an electrical schematic diagram of a preferred embodiment of the present invention.

In FIG. 2, a typical simplified oscillatory circuit for driving an electro-acoustic converter 38, is shown in conjunction with a preferred embodiment of the invention. The switching transistor 10 drives the converter 38 in a conventional manner, see U.S. Pat. No. 3,432,691 by A. Shoh, dated Mar. 11, 1969. The collector voltage is conducted along conductor 16 to a capacitor 40 from which it is conducted to the cathode of a 24-volt zener diode 42 which causes the output of the voltage limiter 14 to be a square wave with a 24 volt peak to peak amplitude. The base electrode 18 of the transistor 10 is coupled to the variable inductor 44 contained in the tuned circuit 22. The circuit is tuned to the desired frequency by proper selection of the inductor 44 and capacitor 46.

The voltage signal along conductor 24 is a 20 volt peak to peak, 20 kHz sinousoidal waveform. The inductor 44 is adjustable for varying the phase angle of the sinousoidal signal with reference to the collector voltage waveform. The phase angle shift will cause the switch 26 to turn on and turn off at different times, thereby affecting the overlap interval and changing the width of the pulses shown in FIG. 3, trace f. It is apparent that by adjusting the inductor 44 the direct current voltage at the output of the integrator circuit 32 is changed and, therefore, the amount of permissible power dissipated in transistor 10 before inhibiting the oscillatory circuit is varied. In this manner, the transistor 10 is capable of providing increased power to the converter 38. In prior embodiments, the switching transistor 10 was designed to operate at a condition for providing less power to the converter 38 and for dissipating less power to allow for large load variations. The present invention permits the transistor 10 to be operated at a higher power condition since load variations, specifically overload conditions, will cause the oscillatory circuit to be turned off prior to a failure of the switching transistor 10.

By proper biasing of the transistor switch 48, a square wave will be apparent at the collector electrode of the transistor 48 responsive to the signal along conductor 24. The square wave output of switch 26 is conducted via a resistor 52 to the base electrode of a p-n-p transistor 50 in overlap circuit 28. The square wave output from voltage limiter 14 is conducted to the emitter electrode of transistor 50. The transistor will conduct current to diode 54 only when the emitter electrode of transistor 50 is at a higher potential than the base electrode of transistor 50. That is, when the voltage at the collector electrode of transistor 10 is in its high condition and the sinousoidal signal along conductor 24 is also in its high condition responsive to collector current flowing in transistor 10. In this case, a current flows through diode 54, through resistor 56 and charges capacitor 58. While the waveform in FIG. 3, trace f shows wide periods of overlap, in actual operation the pulse width is typically very narrow, approximately a spike, which is then integrated by capacitor 58.

In the event that the square wave voltage signal at either the emitter electrode or the base electrode of the transistor 50 is of reduced amplitude or absent, i.e. a direct current signal is apparent due to a failure of the switching transistor 10 or the overload protection circuit, the transistor 50 will conduct current to the diode 54 which wll charge the capacitor 58.

When the direct current voltage at the capacitor 58 exceeds the sum of the base-emitter junction voltage of transistor 60 and the peak point voltage, Vp, of the programmable unijunction transistor 61, current flows from the positive direct current power supply +V' through the programmable unijunction transistor 61 and along conductor 66. The peak point voltage is achieved when the gate 59 is maintained at a constant voltage potential, V gate, and the anode 63 voltage exceeds the constant gate 59 voltage by one diode forward voltage drop. In the present example, the constant voltage between the gate 59 and the voltage V— may be expressed as a ratio of the resistance of resistors 62 and 64.

$$V \text{ gate} = \frac{+V' \times R62}{R62 + R64}$$

The current flowing along conductor 66 is indicative of an overload condition and the current signal is processed for turning off the oscillatory circuit.

Figure 4:
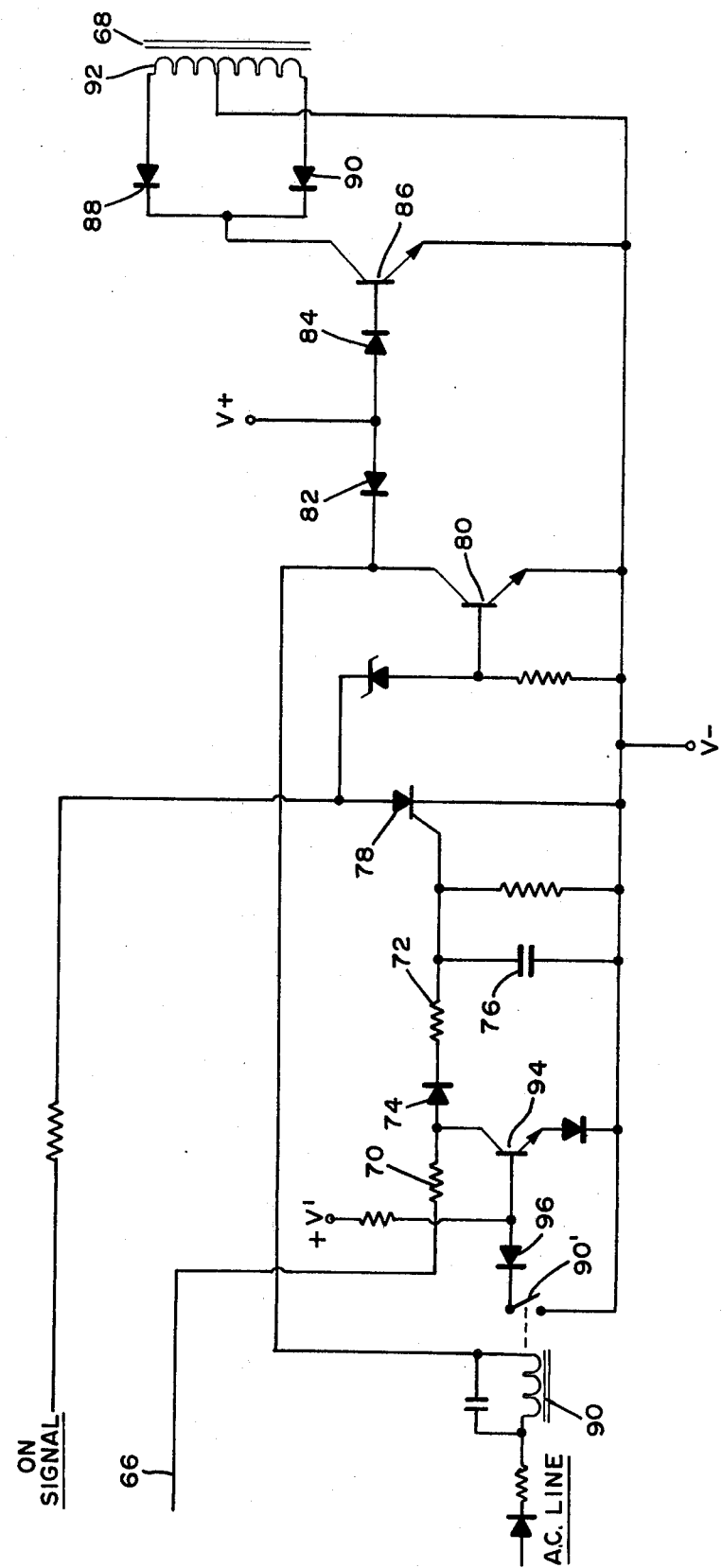
FIG. 4 is a preferred embodiment for turning off an oscillatory circuit in the event of an overload condition.

The signal along conductor 66 may be coupled to logic circuits, a relay, a switch, etc. for interrupting the power lines, the direct current voltage to the oscillatory circuit, etc. In a preferred mode of turning off the oscillatory circuit, an electrical circuit as shown in FIG. 4 is coupled to the conductor 66 and the transformer 68 of the oscillatory circuit for causing a shorted secondary winding 92 on the transformer 68, thereby turning off the oscillatory circuit.

The current flowing along conductor 66 passes through resistors 70, 72 and diode 74 to charge capacitor 76. When the voltage across capacitor 76 exceeds the gate trigger voltage of silicon controlled rectifier (SCR) 78, the SCR 78 turns on, creating a current path from the ON signal to the negative power supply via the SCR 78. The transistor 80 thereby is caused to turn off. The current which was flowing from the positive direct current power supply through diode 82 into the collector electrode of transistor 80 to the negative power supply is now directed instead through diode 84 and the base electrode of transistor 86. The collector electrode of transistor 86 is coupled to the cathode of diodes 88 and 90, the anode of the diodes are connected to respective ends of a transformer 68 winding 92, when transistor 86 turns on, a short circuit is apparent across the winding 92 of transformer 68.

The short circuited transformer winding 92 causes the oscillatory circuit to turn off. When the ON signal is removed, the overload circuit operates in a normal mode, that is, transistor 86 remains on until a subsequent ON signal is apparent. The removal of the ON signal, resets the SCR 78 by removing the holding current flowing to the anode and causes transistor 80 to be in its on condition, which, in turn causes transistor 86 to be turned off. In the described condition, the oscillatory circuit provides power to the converter 38.

To obviate the condition where an overload signal is manifest at initial start up, a relay coil 90 is provided. The relay contact 90' is initially in its open state and transistor 94 is in its on state, thereby coupling the overload signal on conductor 66 to the negative power supply via resistor 70 and transistor 94. After an initial delay, approximately 20 milliseconds, the oscillatory circuit has started, relay contact 90' closes causing current to flow instead of into the base electrode of transistor 94, through diode 96 relay contacts 90' to the negative power supply. Transistor 94 is thereby turned off, and the overload circuit will operate in its normal mode.

In the present embodiment, the positive power supply, V+ is +160 volts direct current with reference to the negative power supply V— and the positive power supply +V' is 24 volts direct current with reference to the negative power supply V—.

While there has been described and illustrated a preferred embodiment of the present invention pertaining to an overload protection circuit for turning off an oscillatory current it will be apparent to those skilled in the art that various changes and modifications can be made without deviating from the broad principle of the invention which is limited only by the scope of the appended claims.

What is claimed is:

1. An electrical circuit for providing overload protection in an oscillatory circuit having at least one switching transistor coupled to the primary winding of a transformer for driving an electro-acoustic converter coupled to a secondary winding of the transformer comprising:
   first means coupled to the switching transistor for providing a signal responsive to the voltage between the collector electrode and the emitter electrode of said switching transistor;
   second means coupled to said switching transistor for providing a signal with adjustable phase, responsive to the voltage between the base electrode and the emitter electrode of said switching transistor;
   overlap detecting means coupled for receiving said signal responsive to the voltage between the collector electrode and the emitter electrode and said signal responsive to the voltage between the base electrode and the emitter electrode and providing an output signal responsive to the occurrence of an overlap of said two mentioned signals;
   integrating means coupled for receiving said output signal from said overlap detecting means and integrating said output signal for providing an overload signal, and
   third means coupled to said integrating means and said oscillatory circuit for receiving said overload signal and inhibiting operation of said oscillatory circuit responsive to said overload signal exceeding a predetermined amplitude.

2. An electrical circuit as set forth in claim 1, said first means comprising voltage limiting means.

3. An electrical circuit as set forth in claim 1, said second means including a tuned circuit for providing a sinousoidal signal responsive to the voltage between the base electrode and the emitter electrode of said switching transistor.

4. An electrical circuit as set forth in claim 3, said tuned circuit including means for varying the phase of said sinousoidal signal from an initial phase.

5. An electrical circuit as set forth in claim 4, and including switch means coupled to said tuned circuit for providing a square wave output signal responsive to the amplitude and phase of said sinousoidal signal.

6. An electrical circuit as set forth in claim 1, said overlap detecting means comprising a transistor operating as a switch for providing an overlap signal when the voltage between said collector electrode and emitter electrode of said switching transistor and the voltage between said base electrode and emitter electrode of said switching transistor are concurrently in their respective high condition.

7. An electrical circuit as set forth in claim 1, said third means including a programmable unijunction transistor.

8. An electrical circuit as set forth in claim 1, and further means coupled to said third means for overriding said overload signal to allow initial start-up.

9. An electrical circuit as set forth in claim 8, said further means comprising a relay.

10. An electrical circuit for providing overload protection in an oscllatory circuit comprising:
- an oscillatory circuit including at least one switching transistor coupled to the primary winding of a transformer for providing power to an electroacoustic converter coupled to a seconday winding of the transformer;
- voltage limiting means coupled to the collector electrode of said switchin transistor for providing a first square wave signal responsive to the voltage between the collector electrode and the emitter electrode of said switching transistor;
- tuned circuit means coupled to the base electrode of said switchin transistor for providing a sinousoidal signal responsive to the voltage between the base electrode and the emitter electrode of said switching transistor;
- switch means coupled to said tuned circuit means for providing a second square wave electrical signal responsive to said sinousoidal signal;
- overlap means coupled to said switch means and said voltage limiting means for receiving said first square wave signal and said second square wave signal and for providng an overlap signal indicative of said first square wave being its high condition simultaneously with said second square signal being in its low condition;
- integrating means coupled to said overlap means for receiving and integrating said overlap signal for providng a direct current signal responsive to the duration of said overlap signal;
- programmable unijunction transistor means coupled to said integrating means for receiving said direct current signal and for providing an overload signal when said direct current signal exceeds a predetermined voltage;
- transistor switch means coupled to said programmable unijunction transistor means for receiving said overload signal and assuming its on condition responsive thereto;
- delay means for inhibiting said transistor switch means from assuming its on condition during an initial start-up period, and
- transformer winding means disposed on the transformer and coupled to said transistor switch means for inhibiting said oscillatory circuit when said transistor switch means assumes its on condition.

* * * * *